United States Patent [19]

Rougeolle et al.

[11] Patent Number: 4,541,009
[45] Date of Patent: Sep. 10, 1985

[54] PROCESS AND DEVICE FOR SAMPLING A SINE WAVE SIGNAL BY A MULTIPLE FREQUENCY SIGNAL

[75] Inventors: Daniel Rougeolle; Pascal Porrot, both of Paris, France

[73] Assignee: Thomson CSF, Paris, France

[21] Appl. No.: 397,341

[22] Filed: Jul. 12, 1982

[30] Foreign Application Priority Data

Jul. 24, 1981 [FR] France ................................ 81 14421

[51] Int. Cl.³ .............................................. H04N 9/32
[52] U.S. Cl. .................................. 358/13; 340/347 SH
[58] Field of Search .................... 358/13; 340/347 SH; 375/95, 119

[56] References Cited

U.S. PATENT DOCUMENTS 3,626,306 12/1971 Puckette ....................... 340/347 SH
3,789,308 1/1974 Lowdenslager ..................... 328/155
4,122,487 10/1978 Beaulier et al. ....................... 358/13
4,301,466 11/1981 Lemoine et al. ...................... 358/13

Primary Examiner—Richard Murray
Attorney, Agent, or Firm—Cushman, Darby & Cushman

[57] ABSTRACT

A method and apparatus for sampling a sine wave input signal E(t) with a sampling signal A(t) so as to minimize, in one adjustment, the phase difference between the input signal E(t) and the sampling signal A(t). The input signal E(t) has a frequency F and a cycle T and is used to generate a signal D(t) which has a frequency kf and a phase which is dependent on the phase of input signal E(t), k is a positive integer. The signal D(t) is used to generate a sampling signal A(t) which has a plurality p of possible phase settings, p is a positive integer. Each phase setting is adjusted, with respect to its neighbor phase settings, by increments of T/kp. The phase difference between the sampling signal A(t) and the input signal E(t) is then determined. One of the p possible phase settings of sampling signal A(t) is then selected which minimizes the phase difference. The sampling signal A(t) will thus have a phase which has been adjusted to within T/kp of the input signal phase, in one jump.

16 Claims, 5 Drawing Figures

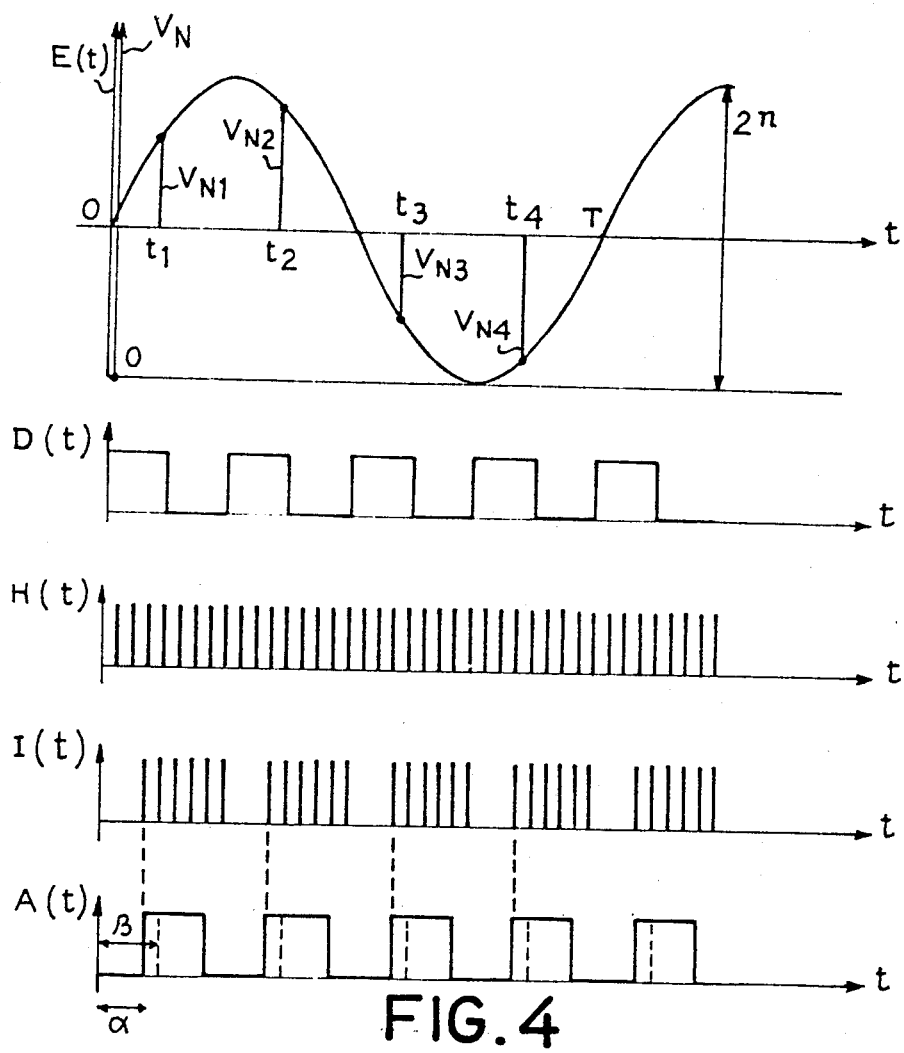
FIG.4
FIG.5
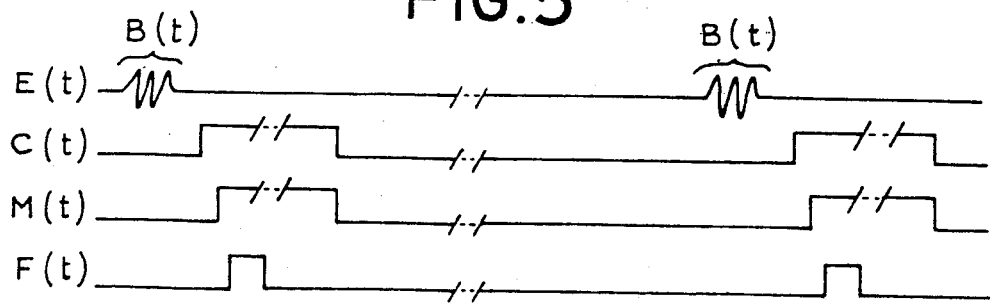

PROCESS AND DEVICE FOR SAMPLING A SINE WAVE SIGNAL BY A MULTIPLE FREQUENCY SIGNAL

BACKGROUND OF THE INVENTION

The present invention relates to a process making it possible to sample a sine wave signal of a given frequency by a signal whose frequency is a multiple of said given frequency and to a device for performing this process.

It is known to perform such a sampling of an input signal, but the prior art devices have a certain inertia with respect to the relative phase setting between the sampling signal and the input signal.

To obviate this disadvantage the process according to the invention makes up for this by an instantaneous jump making it possible to obtain the desired relative phase displacement between the sampling signal and the input signal, i.e. the sampling signal is adjusted to a reference value of the phase of the input signal and the reference value can be zero.

BRIEF SUMMARY OF THE INVENTION

The invention relates to a process for sampling a sine wave signal of frequency F by a sampling signal having a frequency which is a multiple of said frequency and which makes it possible to obtain a minimum relative phase displacement between the sampling signal A(t) and a reference phase value of the input signal E(t). This process comprises the following stages:

generating a sampling signal A(t) of frequency kF with a variable phase with respect to the input signal E(t) and with a frequency equal to the predetermined frequency, k being a positive integer, said phase being regulatable by increments of T/kp, T being the cycle of the input signal and p a positive integer, the sampling signal A(t) being controlled with respect to the input signal E(t);

generating a phase reference signal obtained from the sampling signal A(t) and measuring the relative phase swing of the sampling signal with respect to the input signal E(t);

selection from among the possible phase settings of the sampling signal A(t) in order to minimize the relative phase swing of this signal compared with the reference phase value of input signal E(t).

The invention also relates to a device for performing such a process.

BRIEF DESCRIPTION OF THE DRAWINGS

The invention is described in greater detail hereinafter relative to non-limitative embodiments and the attached drawings which show:

FIGS. 3 and 4 diagrams explaining the device according to the invention.

FIG. 5 diagrams explaining the variant of the device according to the invention.

DETAILED DESCRIPTION OF THE PREFERRED EMBODIMENTS

In the case of a sine wave signal E(t) of given frequency F to be converted into digital form with a sampling signal of frequency kF dependent on the signal E(t), no matter what the phase variations between the dependent signal of frequency kF and the input of frequency F, it is at all times desirable to have a minimum phase error between the sampling signal A(t) and a reference phase value of the input signal E(t), k being a positive integer. The reference phase value of input signal E(t) can be zero.

Figure 1:
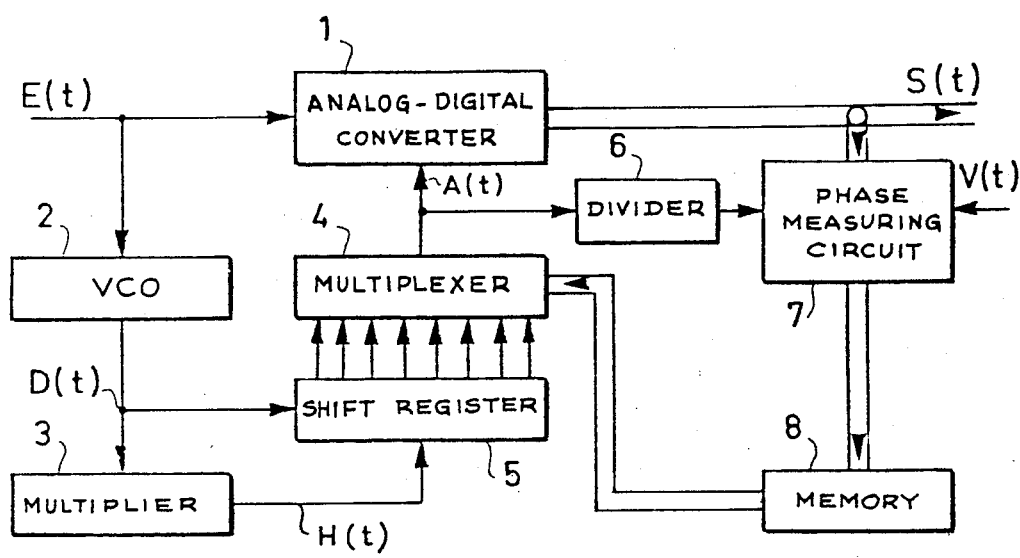
FIG. 1 a diagram representing the device according to the invention.

FIG. 1 shows a sampling device according to the invention. Input signal E(t) is, for example, of form A sin (2 $\pi$Ft). A dependent oscillator 2 of the VCO type, i.e. a voltage control oscillator, makes it possible to obtain a signal D(t) of frequency kF dependent on the signal E(t) of frequency F.

The sampling signal A(t) obtained from said signal D(t) of frequency kF is of regulatable phase compared with the input signal E(t) in p possible positions, p being a positive integer, i.e. the phasing between the sampling signal A(t) and the reference phase of input signal E(t) can be carried out with an error below T/kp, T being the cycle of the input signal. For example, sampling takes place on the rising fronts of signal A(t).

Thus, signal E(t) is sampled by signal A(t) using an analog-digital converter 1 into which said two signals E(t) and A(t) are fed. At the output is obtained the sampled digital signal S(t), the latter being e.g. a signal with multibit binary words.

Figure 3:
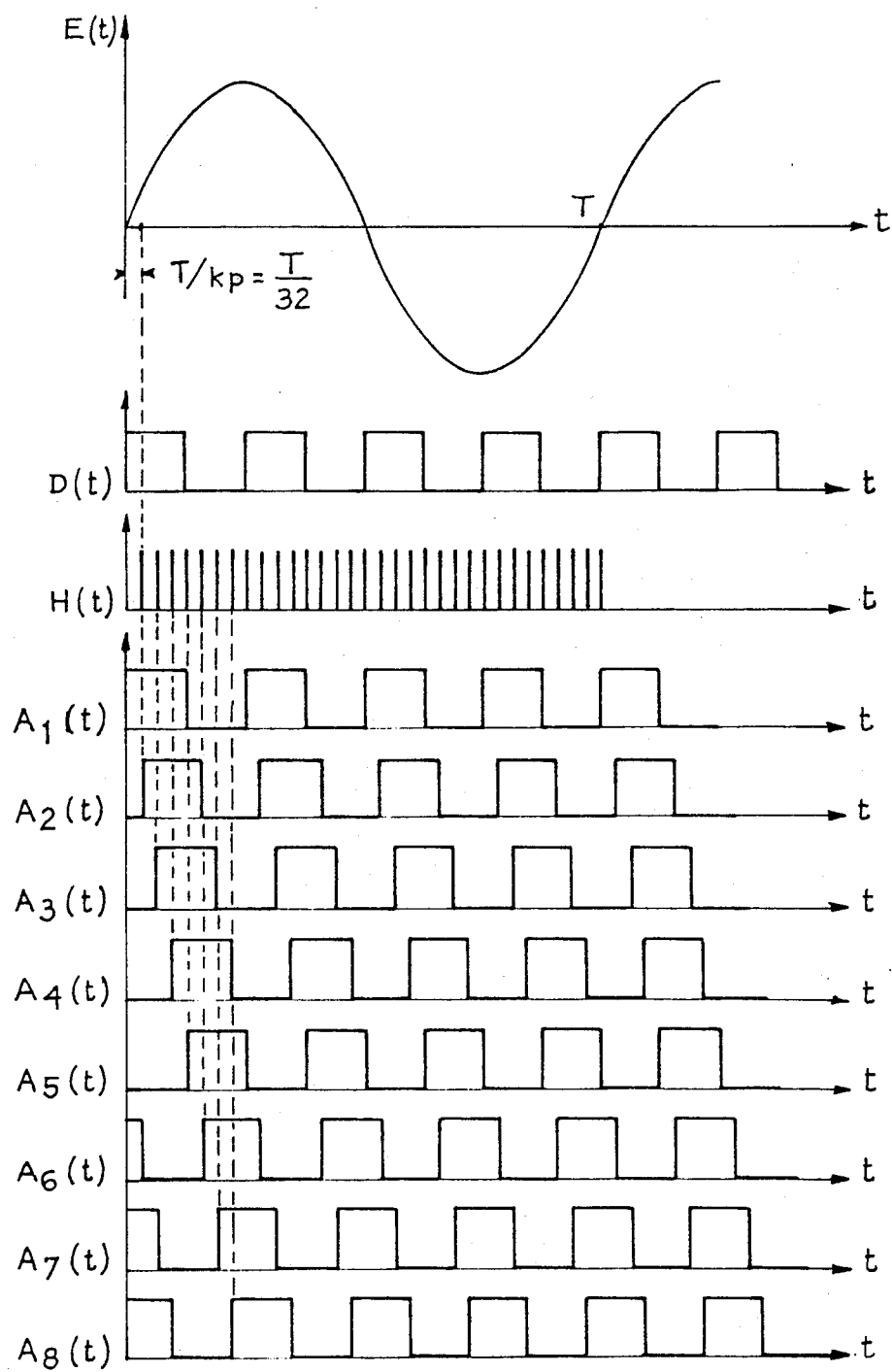

FIG. 3 illlustrates the input signal E(t) of frequency F and the p positions Ai(t) which can be assumed by sampling signal A(t) at the output of the displacement circuit and one of these will be chosen. In the case considered in FIG. 3 k=4 and p=8, so that there are 8 possible displacements of the sampling signal A(t). Thus, when the value of p increases, there is an increase in the accuracy of the setting of the relative phase of sampling signal A(t) with respect to the input signal E(t).

The relative phase between the sampling signal A(t) and the input signal E(t) is measured in a phase measuring circuit 7, which measures the phase swing between signal S(t) and a signal of frequency F obtained on the basis of the sampling signal A(t) after frequency division by k in a divider 6. This signal of frequency F is therefore used as a phase reference with respect to input signal E(t).

The result of the phase swing measurement makes it possible to select one of the phases of the sampling signal A(t) in order to minimize the relative phase between signal A(t) and the phase reference value of input signal E(t).

For carrying out this selection, it is possible to use a memory 8, e.g. of the programmable read-only memory or PROM type in which is stored a table which makes it possible to bring about correspondence between one of the control words and the measured phase swing.

In order to obtain a sampling signal A(t) with a phase adjustable in p positions with respect to the input signal, the signal from oscillator 2 of frequency kF is fed into a shift register 5 controlled by a clock signal H(t) of frequency pkF obtained by multiplication by p in a multiplier 3 of the frequency kF of the signal from the controlled oscillator. This multiplication of frequency kF by p can be performed e.g. through the use of a filter tuned to the frequency pkF which it is desired to obtain. The outputs of shift register 5 are connected to the inputs of a multiplexer 4 which selects one of the p outputs of said shift register 5 and in this way one of the p possible phases of the sampling signal A(t) is selected. This multiplexer is controlled by a control word from memory 8, which is a function of the relative phase swing between the sampling signal A(t) and the input signal E(t).

The signal from the phase measuring circuit 7 is used, for example, for addressing the PROM 8. Bearing in mind the phase error and the adjustment of Ai(t) in steps of T/kp, one input of the multiplexer is selected, which leads to a residual phase error $\gamma$ such that $0 \leq \gamma \leq T/kp$. The analog-digital converter is of the type having one output in parallel. According to another, not shown, variant, it is also possible to use an analog-digital converter with a series output. This explains the presence of the buses represented in double line form in FIG. 1 and also in FIG. 2.

Signal V(t) is a phase measurement validation signal. It is, for example, a logic signal forming a window in which the phase measurement must take place when in state "1" and outside this window the phase measurement calculation is invalidated.

Figure 2:
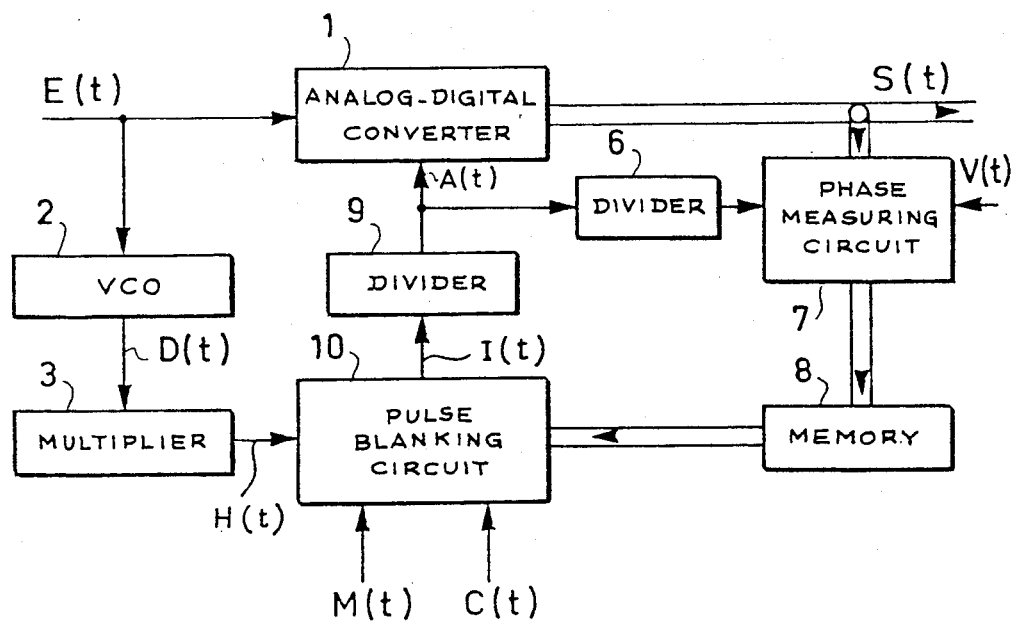
FIG. 2 a diagram representing a variant of the device according to the invention.

FIG. 2 illustrates another way of obtaining a sampling signal A(t) regulatable in phase compared with input signal E(t). The sampling process remains the same as that described hereinbefore only circuits 4 and 5 of FIG. 1 are replaced by circuits 9 and 10 of FIG. 2.

Instead of selecting one of the p outputs of a shift register 5 by means of a multiplexer 4, a certain number of the pulses of the clock signal of frequency pkF obtained at the output of multiplier 3 are eliminated or blanked. As a result of this, a signal I(t) is obtained and then by dividing the frequency of this signal by p, it is possible to obtain a sampling signal A(t) of phase regulatable in p positions compared with the input signal E(t).

For this purpose a pulse blanking circuit 10, connected to the output of multiplier 3, is controlled by a circuit from memory 8 in which a correspondence table has been stored. Memory 8 is controlled by the same type of control as that described for FIG. 1, i.e. the memory is e.g. of the PROM type. It contains a correspondence table making it possible to obtain a control word, which is a function of the measured phase swing. This blanking circuit also has two control inputs receiving the signals M(t) and C(t).

Signal M(t) is a signal authorizing the modification of the phase of sampling signal A(t). Signal C(t) is a signal permitting the loading of counters to a value equal to the number of pulses of the signal of frequency pkF to be blanked, which then makes it possible to deduct said number of pulses to be blanked. The output of the blanking circuit is connected to the input of a divider by p 9.

The diagram of FIG. 4 illustrates the conversion process.

In a specific embodiment, the analog-digital converter 1 is a converter with parallel outputs, e.g. supplying a 9 bit binary coded word, the most significant bit representing the sign. The peak-to-peak amplitude of the sine wave signal can be broken down into $2^n$ increments, i.e. 512 in the present embodiment.

In conventional manner, the sampling signal A(t) is derived from a signal D(t) of frequency kF, said signal D(t) being dependent in phase on the input signal E(t). For this purpose a known frequency multiplier 3 is used, k being chosen equal to 4. The diagram shows the pulses constituting the respective signals D(t), H(t), I(t), and A(t). The phase displacement of signal A(t) compared with signal E(t) is equal to $\alpha$ shown on the time axis.

Sampling takes place at times $t_1$, $t_2$, $t_3$ and $t_4$ within a cycle T of the signal and successive 9 bit words representing the amplitude of these samples $V_{N1}$ to $V_{N4}$ are available at the parallel outputs of the analog-digital converter 1 after the sampling times.

In numerous applications, the phase displacement between the signal to be converted E(t) and the sampling signal A(t) must be constant and equal to a predetermined value, which is defined in amplitude and in sign. Hereinafter this reference value is called $\beta$ or the nominal value.

In actual fact, and as shown in FIG. 4, the true phase displacement $\alpha$ differs from the nominal value $\beta$, which would be obtained by the sampling signals shown in broken lines (only the rising fronts characterizing the sampling times being shown).

There are numerous methods for minimizing the difference between $\alpha$ and $\beta$, which will subsequently be called the residual phase error $\phi$, $\phi$ being given by the relationship: $\phi = \beta - \alpha$.

The process for measuring the residual phase error signal falls outside the scope of the invention. However, it may be useful to briefly describe a process enabling this measurement to be briefly and accurately and rapidly performed and which is particularly suitable for the present invention.

According to this process the input signal E(t) to be converted is sampled, in the same way as described with respect to the diagram of FIG. 4 using a signal A(t) of quadruple frequency of signal E(t). In the present embodiment, the analog-digital converter supplies a 9 bit binary word, the most significant bit representing the sign of the sample, so that there are 512 possible digital levels.

With a sine wave input signal of form $E(t) : A \sin(2\pi Ft)$, the sample $V_{N1}$ representing $\sin \alpha$ and the sample $V_{N2}$ representing $\cos \alpha$ are obtained within a cycle. When the digital value of the sample exceeds 256 (positive arch of the sine curve) this digital value is directly used for calculating the two functions. In the opposite case, i.e. between 0 and 256 (negative arch), there is a twos complement of the digital value supplied by the converter. Discrimination takes place by examining bit $2^8$ representing the sign. In reality, the sampled values respectively represented $A \sin \phi$ and $A \cos \phi$, A being the maximum amplitude of the analog signal. In order to overcome the coefficient A, $\tan \phi$ or $\cotan \phi$ are then calculated, as a function of $A|\sin \phi|$. For this purpose a comparison is made between the two latter values.

According to this process, the absolute values of $\tan \phi$ and $\cotan \phi$ are calculated in the following way:

$$|\tan \phi| = A|\sin \phi| \times 1/(A|\cos \phi|)$$

and $$|\cotan \phi| = A|\cos \phi| \times 1/(A|\sin \phi|)$$

The inversion of the functions $A|\cos \phi|$ and $A|\sin \phi|$ can be brought about by using programmable read-only memories identical to those used in the device described relative to FIG. 1 and addressed by binary words representing $A|\cos \phi|$ and $A|\sin \phi|$.

As has been stated hereinbefore, as a function of the result of the comparison between values $A|\sin \phi|$ and $A|\cos \phi|$, in a final stage of the process the angle $\phi$ is calculated respectively on the basis of $\tan \phi$ or $\cotan \phi$. For performing this calculation it is also possible to use a PROM addressed by the binary word representing tan $\phi$ or cotan $\phi$ and supplying a binary word at its output, which represents the sought residual phase error.

As a result of this process, the measurement of $\phi$ is independent of the amplitude of the sine wave signal and the precision obtained is only dependent on the number of bits supplied by the analog-digital converter. Within the scope of the chosen embodiment, the precision with 9 bits is greater than 1°.

Thus, the latter method makes it possible to be independent of the amplitude of the input signal E(t), which is very important when the amplitude varies e.g. in the cse of a video burst signal. In addition, maximum accuracy is obtained with a high calculation speed.

This method of measuring phase $\phi$, as well as the device illustrated in FIG. 2, can be considered e.g. with an input signal E(t) constituted by a PAL or NTSC television signal, with p=8. The composite PAL or NTSC signal has, at the start of each line, a burst B(t) constituted by a fraction of the color subcarrier. This sine wave signal makes it possible to measure the sampling phase of signal A(t) and to correct it for each line in such a way that the sampling signal is in phase with the subcarrier. For this purpose, after measuring the phase by means of circuit 10, for each line a certain number of pulses of the signal of frequency pkF (with p=8, k=4), are eliminated or blanked in order to obtain the minimum phase swing of the sampling signal A(t) compared with the subcarrier signal. Signal V(t) only validates the phase measurement for the duration of signal B(t).

In FIG. 5, signal E(t) is a composite television signal of the type used in a field simultaneous color television system. This signal is divided into time intervals representing the scanning line of a display means and has at the start of these intervals a burst of high frequency sine wave signals or so-called subcarrier signals B(t). Signal C(t) represents the loading signal of the counters, which are loaded to the number of pulses of the signal of frequency pkF (with p=8 and k=4) to be blanked in circuit 10. Signal M(t) is the signal for authorizing the modification of phase $\phi$ and F(t) is the time window making it possible to blank the correct number of pulses of the signal of frequency pkF for regulating the phase of sampling signal A(t).

In the case when input signal E(t) is a television signal, the minimum phase displacement to be obtained is that between the sampling signal and the colour subcarrier, which has a frequency F of approximately 4 megahertz. In this case, the minimum phase displacement which can be obtained is $1/32 \times 360° = 11°$.

For example the analog-digital converter has 9 bits and a parallel output of type DC 1019 marketed by the TRW company.

The device according to the invention can in particular be used in magnetoscopes.

While the invention has been described in connection with what is presently considered to be the most practical and preferred embodiment, it is understood that the invention is not to be limited to the disclosed embodiment but, on the contrary, is intended to cover various modifications and equivalent arrangements included within the spirit and scope of the appended claims which scope is to be accorded the broadest interpretation so as to encompass all such modifications and equivalent structures.

What is claimed is:

1. A process for sampling a sine wave input signal E(t) having frequency F and a reference phase value, by a sampling signal A(t) having a frequency kF, where k is a positive integer, so as to produce a minimum relative phase displacement between said signals, comprising the following steps:
   generating a signal D(t) of frequency kF, which is dependent in phase on said input signal E(t);
   generating a sampling signal A(t) of frequency kF, on the basis of said signal D(t), with a plase regulatable compared with said input signal E(t) in increments of T/kp, T being the cycle of said input signal E(t) and p a positive integer, said sampling signal A(t) having a plurality of possible phase settings;
   generating a phase reference signal from said sampling signal A(t) and measuring a relative phase swing of said sampling signal A(t) compared with said input signal E(t);
   selecting one of said plurality of possible phase settings of said sampling signal A(t) so as to minimize said relative phase swing of said signal compared with said reference phase value of the input signal E(t).

2. A process according to claim 1, wherein said reference phase value of said input signal is zero.

3. A process according to claim 1, wherein said generating and measuring step includes the steps of:
   generating a digital multibit binary word signal S(t) of frequency F from said input signal E(t);
   generating a signal of frequency F by dividing said sampling signal A(t) by k; and
   measuring said relative phase swing between said signal S(t) and said divided signal.

4. A process according to claim 3, wherein said input signal E(t) is a composite television signal of a field simultaneous color television system, said television signal being divided into time intervals representing scanning lines of a display means with, at the start of said intervals, a burst of high frequency sine wave or so-called subcarrier signals, and wherein p equals 8 and k equals 4n, with n being an integer equal to or higher than 1.

5. A process according to claim 4, wherein said field simultaneous color television system is PAL.

6. A process according to claim 4, wherein said field simultaneous colour television system is NTSC.

7. A device for sampling a sine wave input signal E(t), having a frequency F and cycle T and a phase, by a sampling signal A(t) of multiple frequency kF where k is a positive integer and producing a minimum relative phase displacement between said signals, comprising:
   controlled oscillator means, having an output, for generating a reference signal D(t) having a frequency kF and a phase which is dependent on said input signal phase;
   phase regulating means, having an inpuut connected to said output of said controlled oscillator means and a displacement control input and an output supplying said sampling signal A(t), for receiving said reference signal D(t) and generating said sampling signal A(t) having a plurality p of possible phase settings each one being shifted by T/kp with respect to its neighboring phase shift setting;
   analog-digital converter means, having a sampling input, for converting said input signal E(t) into a digital output signal S(t) and receiving at said sampling input said sampling signal A(t);

displacement control means, having first and second inputs, said first input being connected to said output of said phase regulating means and said second input receiving said digital output signal S(t), and one output connected to said displacement control input of said phase regulating means, for measuring the relative phase displacement between said input signal E(t) and said sampling signal A(t), and for selecting one of said plurality of phase settings which minimizes said relative phase displacement.

8. A device according to claim 7, wherein said phase regulating means includes:
means for multiplying said frequency F by p, said multiplying means having an output and an input connected to said output of said controlled oscillator means;
shift register means having p stages and an input connected to said output of said controlled oscillator means and an input connected to said output of said frequency multiplier, for providing said plurality of phase shift settings for said sampling signal A(t); and
multiplexer means having p inputs connected to said p stages of said shift register means and having a displacement control input connected to said output of said displacement control means, for selecting said one of said plurality of phase settings, as a function of the measured relative phase displacement.

9. A device according to claim 7, wherein said phase regulating means includes:
means for multiplying said frequency F by p and providing a signal H(t) having a given number of pulses, said multiplying means having an output and an input connected to said output of said controlled oscillator means;
pulse blanking means, connected to said multiplier means output and having a displacement control input connected to said output of said displacement control means, for blanking a certain number of pulses of said signal H(t) and producing a signal I(t) having a phase setting which minimizes said relative phase displacement; and
means for dividing said signal I(t) by p and providing said sampling signal A(t), said dividing means having an input connected to said pulse blanking means and an output connected to said analog-digital converter means.

10. A device according to claim 7, wherein said displacement control means includes:
means for measuring the relative phase between said sampling signal and said input signal; and
memory means, connected to said measuring means and to said displacement control input, for storing a correspondence table containing information matching given values of phase measurements with said plurality of phase shift settings, and for supplying said selected one of said plurality of phase shift settings to said phase regulating means in response to the phase difference measured in said measuring means.

11. Apparatus for sampling a sine wave input signal E(t) having a phase and a frequency F and a cycle T, with a sampling signal A(t) having a frequency kF, k being a positive integer, to produce a sampled digital signal S(t) having a minimum relative phase difference from said signal E(t), comprising:
means, adapted to receive said signal E(t), for generating a plurality p of signals Ai(t) each having a frequency kF and a phase which is adjusted by T/kp with respect to neighboring ones of said plurality of signals Ai(t), p being a positive integer;
means connected to said generating means, for providing said sampling signal A(t) which is one of said plurality of signals Ai(t) having a minimum phase difference from said signal E(t) phase; and
means, connected to said providing means and adapted to receive said signal E(t), for converting said signals E(t) and A(t) into said sampled digital signal S(t).

12. Apparatus according to claim 11 wherein said generating means includes:
oscillating means, adapted to receive said signal E(t), for generating a reference signal D(t) having a frequency kF and a phase which is dependent upon said signal E(t) phase;
multiplier means, connected to said oscillating means, for multiplying said signal D(t) and providing a signal H(t) having a frequency kpF; and
means for receiving said signal H(t) and providing said plurality p of signals Ai(t).

13. Apparatus according to claim 12 wherein said providing means includes:
means for receiving said sampling signal A(t) and dividing it by k to produce a phase reference signal having a frequency F;
means for receiving said phase reference signal and said signal S(t) and measuring a relative phase difference between said signals; and
means for receiving the measured relative phase difference and providing one of said plurality of signals Ai(t) having the minimum relative phase difference from said signal S(t) to said converting means.

14. A method of sampling a sine wave input signal E(t) having a phase and a frequency F and a cycle T, with a sampling signal A(t) having a frequency kF, k being a positive integer, to produce a sampled digital signal S(t) having a minimum relative phase difference from said signal E(t), comprising the steps:
receiving said signal E(t) and generating a plurality p of signals Ai(t) each having a frequency kF and a phase which is adjusted by T/kp with respect to neighboring ones of said plurality of signals Ai(t), p being a positive integer;
providing said sampling signal A(t) which is one of said plurality of signals Ai(t) having a minimum phase difference from said signal E(t) phase; and
converting said signals E(t) and A(t) into said sampled digital signal S(t).

15. A method according to claim 14 wherein said generating step includes the steps of:
generating a reference signal D(t) having a frequency kF and a phase which is dependent upon said signal E(t) phase;
multiplying said signal D(t) and providing a signal H(t) having a frequency kpF; and
providing said plurality p of signals Ai(t).

16. A method according to claim 15 wherein said providing step includes the steps of:
dividing said sampling signal A(t) by k to produce a phase reference signal having a frequency F;
measuring a relative phase difference between said phase reference signal and said signal S(t); and
providing one of said plurality of signals Ai(t) having the minimum relative phase difference from said signal S(t) to said converting step.

* * * * *